US006825468B2

(12) United States Patent
Oi et al.

(10) Patent No.: US 6,825,468 B2
(45) Date of Patent: Nov. 30, 2004

(54) FINE STENCIL STRUCTURE CORRECTION DEVICE

(75) Inventors: Masamichi Oi, Chiba (JP); Tatsuya Asahata, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 0 days.

(21) Appl. No.: 10/612,567

(22) Filed: Jul. 2, 2003

(65) Prior Publication Data

US 2004/0031936 A1 Feb. 19, 2004

(30) Foreign Application Priority Data

Jul. 3, 2002 (JP) ........................................ 2002-195065

(51) Int. Cl.[7] .......................... G01N 13/12; H01J 37/00
(52) U.S. Cl. .................. 250/311; 250/310; 250/396 R; 250/397; 250/492.2; 250/396 ML; 250/492.22; 250/492.3
(58) Field of Search ................................. 250/310, 311, 250/396 R, 396 ML, 397, 492.2, 492.22, 492.3

(56) References Cited

U.S. PATENT DOCUMENTS 4,798,953 A * 1/1989 de Chambost .............. 250/310
5,148,033 A * 9/1992 Yamada et al. ........... 250/492.2
5,578,821 A * 11/1996 Meisberger et al. ........ 250/310

* cited by examiner

Primary Examiner—Nikita Wells
(74) Attorney, Agent, or Firm—Adams & Wilks

(57) ABSTRACT

A fine stencil structure correction device has a charged particle beam microscope lens-barrel which scans and corrects shapes of defect portions of a fine stencil structure sample using an etching or deposition function, and the fine stencil structure correction device further comprises transmitted beam detecting means for detecting a transmitted beam which is the charged particle beam penetrating the sample provided on a sample stage when the sample is scanned by the charged particle beam.

28 Claims, 8 Drawing Sheets

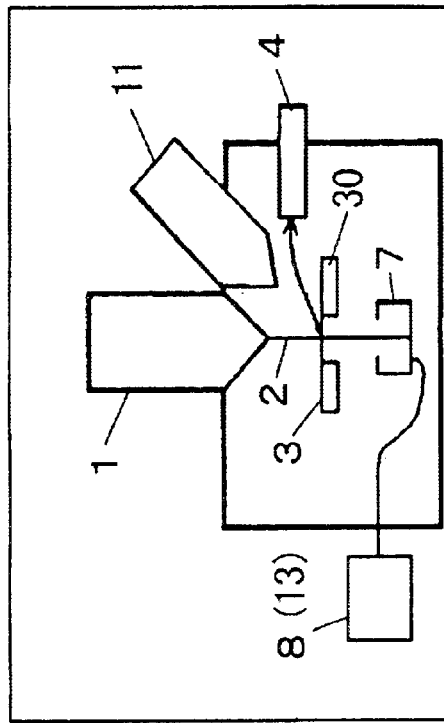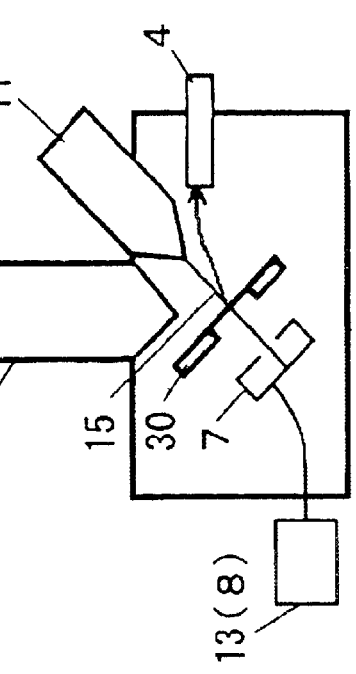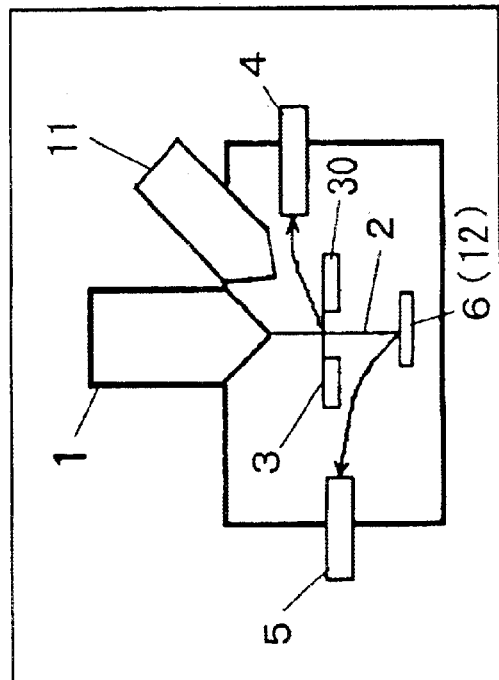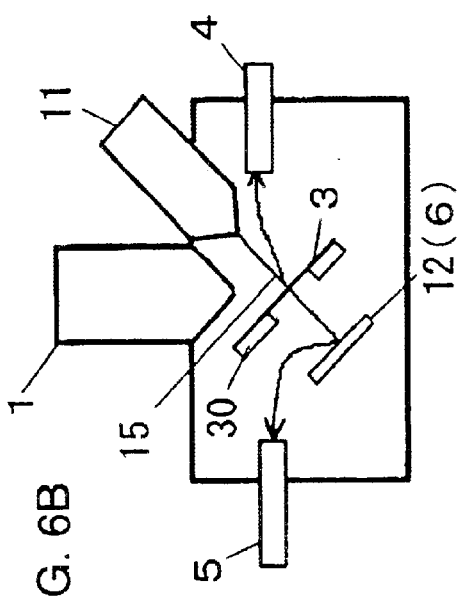

FINE STENCIL STRUCTURE CORRECTION DEVICE

BACKGROUND OF THE INVENTION

1. Field of the Invention

The present invention relates to technology for correcting shape defects in samples having fine stencil structures such as stencil masks for Electron beam Projection Lithography (EPL).

2. Description of Related Art

Increases in the level of integration in LSI's and systemization have led to the possibility in recent years of small, highly functional electronic equipment such as personal computers and mobile telephones. Circuit patterns are drawn with a few million elements packed onto a semiconductor chip of a few millimeters in every direction so as to have a line width from a micron order to a nano-order and development of lithographic technology for implementing this is expanding. Until now, the main focus of lithography has been optical lithography technology. There, the wavelength of light used is taken to be extremely short to correspond to the fine detail of the pattern, and short wavelength lasers were used. This processing has also, however, encountered problems with the optical systems and the resists and compatibility of the optical exposure devices with fine detail is also reaching its limit. Much is therefore expected from technology for replacing light with a source such as an electron beam or ultra-short-wave ultra-violet light. mask for electron beam exposure used in lithography taking an electron beam as a source can be determined using exposure tests using an actual exposure device or observing a transmission image of an electron beam device such as an electron microscope. Defects are corrected in electron beam exposure masks in which defects have appeared using the elimination of foreign bodies that have become attached (black defect correction) utilizing an etching function of a Focused Ion Beam (FIB) device and by using additional defect portion processing (white defect correction) utilizing an ion beam induction deposition function. Further, the surface (sample surface) of a mask for electron beam exposure is irradiated with and scanned by a focused ion beam so that secondary charged particles (for example, secondary electrons, secondary ions etc.) emitted from the sample surface are detected by a secondary charged particle detector positioned to the front of the sample surface (ion source side). A scanning ion microscope (Scanning Ion Microscope: SIM) image is then obtained from the information for the sample surface, and the location and shape of the defects is determined. The appearance of the advancement of the processing is monitored, the shape after implementation of defect correction is confirmed, and a determination is made as to whether or not the target processing is complete.

However, it is necessary for the electron beam exposure mask to have a certain degree of thickness in accordance with the energy of electron beams used in exposure and the material of the electron beam exposure mask in order that the electron beam exposure mask is impermeable with respect to an electron beam. An opening for allowing an electron beam to pass is made narrow in order to provide compatibility with the fine detail of the exposure pattern rule. The dimension of the thickness with respect to the width is therefore an ultra-fine stencil structure of a high aspect ratio. As the aspect ratios of structures increase, defect portions that are at deep portions from the surface of the opening are such that secondary electrons generated by the ion beam irradiation do not easily reach a detector so that sufficient electrons are not caught and it is therefore difficult to observe an SIM image from the surface direction. Namely, it is difficult for secondary electrons from a deep hole or from the bottom of a deep channel to reach a detector via an opening in the mask surface, and it is difficult to reliably determine the shape of the defect correction portion from a related SIM image. Because of this, it is not possible to reliably confirm the finished shape of deep portions and remaining fragments of material that should have been removed therefore occur.

With ion beams where particle diameter and mass are large, and electron beams where these properties are small, transmission characteristics with respect to the sample (electron beam exposure mask) differ. Therefore, even with technology for accurately comprehending three-dimensional defect structures utilizing the fact that it is possible for ion beams to cause secondary electrons to be ejected from deeper portions of material, or with technology for carrying out three-dimensional evaluation (scanning) of defect correction results, or for scanning deep portions of a thick sample (ultra-fine stencil structure) with a high aspect ratio, this is difficult while only monitoring an SIM image from the surface direction. Because scanning and confirmation of the shape after correction of the electron beam exposure mask that has been subjected to defect correction using FIB by microscopic observation using the same FIB device is difficult for the reasons given above, evaluation scanning (exposure shape, projected image, confirmation of surface shape using SEM image) using other electron beam devices such as exposure devices and transmission electron microscopes (TEM), or scanning electron microscopes (SEM) etc. is carried out. However, repeating a cycle of correction and scanning between these devices involves a complicated and troublesome procedure where the sample is extracted from the vacuum chamber of one device and moved to a chamber of another device, the environmental conditions are adjusted, positioning alignment is carried out, and processing and scanning is then implemented. There is also the fear that new defects will occur as a result of dirt becoming attached as a result of the movement of the sample.

Further, in the case of scanning using the electron beam, it is necessary to observe both an SEM image for observing surface shape and a transmission image corresponding to a projected image for the opening. It is therefore necessary for the electron beam to be incident to the mask surface from an orthogonal direction. As the electron beam is incident perpendicular to the electron beam exposure mask surface, with, for example, devices such as a related FIB-SEM dual device shown in FIG. 10A where an FIB lens barrel 1 and SEM lens barrel 11 are fitted at a certain angle (for example, 55 degrees), when changing between correction (FIG. 10A) and scanning (FIG. 10B), as shown in the drawings, it is necessary to incline the stage at a substantial angle, and even in a situation where the FIB lens barrel 1 and the SEM lens barrel 11 are separated by a certain distance so as not to interfere with each other as shown in FIG. 10C, it is necessary to move the stage 30 substantially in the horizontal direction from the situation during correction in FIG. 10C to the situation during scanning in FIG. 10D. These related dual FIB-SEM devices are advantageous from the point of view of dirt becoming attached and the shortening of the operation time because it is not necessary to move the sample between the devices. However, also with regards to the ion beam for correcting defects, in order to achieve perpendicularity of wall surfaces after processing, it is necessary for the ion beam to be precisely vertically incident with respect to the mask surface and substantial movement of the sample stage is therefore necessary, which is disadvantageous with respect to processing accuracy.

In order to resolve the aforementioned problems, the present invention provides a focused ion beam device capable of not only performing processing to correct defects in an electron beam exposure mask of an ultra-fine stencil structure, but also capable of observation of microscopic images of defect portions for portions that are deep portions from the surface of an opening.

SUMMARY OF THE INVENTION

In accordance the present invention, there is provided a fine stencil structure correction device characterized by a device for irradiating and scanning with a charged particle beam so as to correct shapes of defects at locations of a fine stencil structure sample using an etching and/or deposition function, where means for detecting a transmitted beam is located on the opposite side of the sample as viewed from the beam source. An absorbed current detector or a combination of a transmitted beam target and a secondary charged particle detector can be adopted as the detection means.

Further, after processing using an FIB, lens barrels for a Scanning Electron Microscope (SEM), Scanning Transmission Electron Microscope (STEM) and a Transmission Electron Microscope (TEM) can be the same FIB lens barrel and be located in the same vacuum chamber in order to confirm processing results without it being necessary to move the fine stencil structure sample outside of the device. This keeps movement of the sample extremely small. Further, a transmission electron microscope function is provided as a primary beam for observation, and a projection plate such as a fluorescent plate etc. for enlarging and projecting transmitted electrons can be adopted as means for detecting a transmitted beam located to the rear of the sample.

The primary beam for use in processing and the primary beam for use in observation are arranged facing each other so as to sandwich the fine stencil structure sample. Each detector for each transmitted beam is retracted when not in use so as not to irradiate a beam to the other detector.

The means for detecting a transmitted beam located to the rear of the sample functions both as an absorbed current detector and a beam target for emitting secondary electrons, and has three positions for ensuring there is no obstruction to other beam emissions or to switching these functions over.

BRIEF DESCRIPTION OF THE DRAWINGS

FIG. 1A shows an example using a target for generating secondary electrons as a transmitted beam detector and FIG. 1B shows an example using a transmitted probe current detector (absorbed current detector).

FIGS. 6A–6D are a view illustrating an embodiment where an FIB lens barrel and an EB lens barrel are arranged at positions facing each other and which adopts a target for generating secondary electrons and a probe detector as the transmitted beam detector.

DETAILED DESCRIPTION OF THE PREFERRED EMBODIMENTS

Figure 2A:
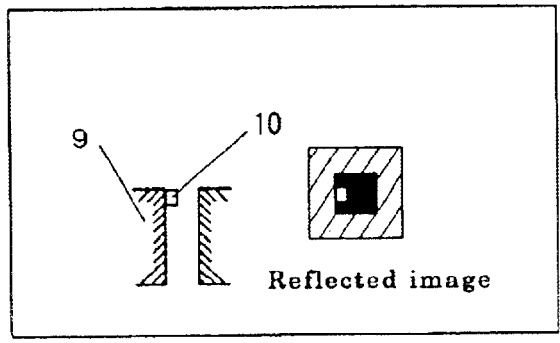
FIGS. 2A, 2B are illustrating the relationship between defect position and observed image for a through-hole structure for an electron beam exposure mask of a high aspect ratio taken as the target of the present invention.
Figure 2B:
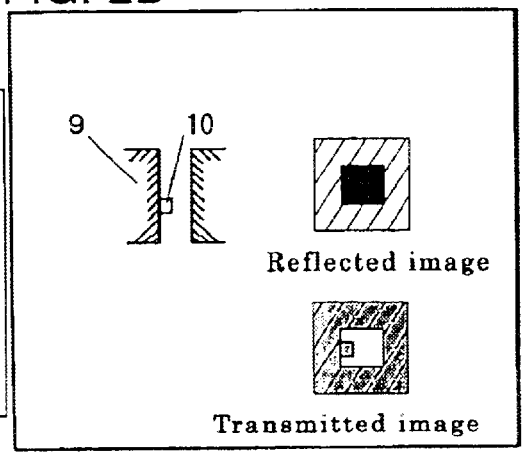

Defects in portions near the surface in electron beam exposure masks of an ultra-fine stencil structure of a high aspect ratio as shown in FIG. 2A can be monitored using a scanning ion microscope (SIM). However, as shown in FIG. 2B, defect portions for portions that are deep from the surface of the opening cannot be observed as a microscopic image by detecting secondary particles using a detector. Observation of these kinds of defects is possible through observation of a transmitted image using a transmission electron microscope. However, correcting defects using a focused ion beam (FIB) device as described above and then moving the sample to a transmission electron microscope for scanning is inconvenient. The present invention implements observation by taking a microscopic image of a defect in a portion deep down from the surface of an opening occurring in an electron beam exposure mask of an ultra-fine stencil structure with a high aspect ratio, and it is conceived that an FIB device itself possesses a function capable of observing a transmitted image, with this utilizing the fact that the electron beam exposure mask (for example, EPL mask, LEEPL mask, etc. ) has a through-hole structure.

Figure 1A:
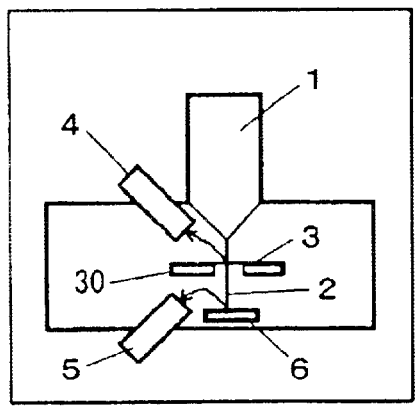
FIGS. 1A, 1B show the basic configuration of the present invention, where

The basic configuration of the present invention is shown in FIG. 1A. The apparatus has a sample stage 30 for fixing and moving a sample relative to the FIB lens barrel 1, the sample being a mask 3 for defect correction, a secondary charged particle detector 4 for detecting secondary charged particles discharged from the sample 3 receiving the focused ion beam 2 and a gas gun (not shown). The foregoing elements are the same as those of a conventional FIB device. The configuration specific to the present invention deploys a target for secondary electron generation 6 arranged at the rear of the sample stage 30 and a secondary charged particle detector 5 arranged at the rear of the sample stage 30 for detecting secondary charged particles emitted from the target 6. Further, the sample stage 30 is provided with a hole at a central portion to allow a primary beam (ions, electrons) to be incident from a vertical direction and detect transmitted particles of the primary beam in a vertical direction, and for carrying out detection of secondary particles. Further, the sample stage 30 has a function capable of controlling an angle of inclination of the mask with respect to an arbitrary direction in order to implement perpendicularity of the processing shape.

An ion beam 2 irradiated from an FIB barrel 1 reaches the target for secondary electron generation 6 arranged to the rear of the sample stage 30, secondary electrons are discharged from this portion, and the electrons are detected by the secondary charged particle detector 5. The transmitted image shown in FIG. 2B is obtained when this detection signal is made to correspond to the beam deflection information and displayed as a scanning image. This is a transmitted image and defects at positions that are shallow with respect to the surface of the opening in the electron beam exposure mask are also detected in the same manner as for defects at deep portions.

Figure 1B:
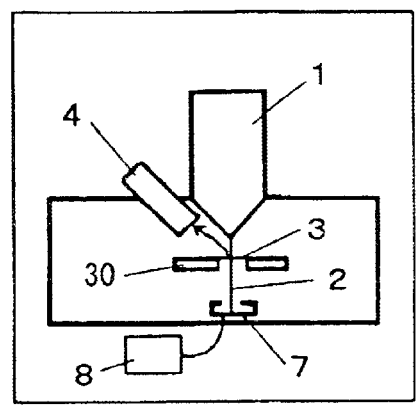

As shown in FIG. 1B, a transmission probe current detector 7 is provided to the rear of the sample stage 30 in place of the target for generating secondary electrons 6 and a microscopic current ammeter 8 for measuring current detected by the transmission probe current detector 7 is also provided in place of the secondary charged particle detector 5. The ion beam 2 irradiated from the FIB lens barrel 1 reaches the transmission probe current detector 7 arranged to the rear of the sample stage 3, ions constituting the charged particles are received, and a microscopic current flowing is measured by the microscopic current ammeter 8. The transmitted image shown in FIG. 2B is also obtained when this measurement signal is made to correspond to the beam deflection information and displayed as a scanning image. This is a transmitted image and defects at positions that are shallow with respect to the surface of the opening in the electron beam exposure mask are also detected in the same manner as for defects at deep portions.

In the above example, the FIB lens barrel for carrying out defect correction and the FIB lens barrel for scanning to monitor the sample are used in common and a transmitted beam detector arranged to the rear of the sample stage is used when observing the sample. It is therefore not necessary to move the sample 3 either during correction processing or during scanning, so troublesome procedures and consumption of time are avoided and there is no fear of new defects being created due to dirt becoming attached during movement of the sample.

Here, an absorbed current detector, a beam target for emitting secondary electrons, and a secondary charged particle detector are shown as constructing means for detecting transmitted beams arranged to the rear of the sample, but it is also possible to adopt an approach where both functions are combined as shown in FIG. 5.

First Embodiment

Figure 3A:
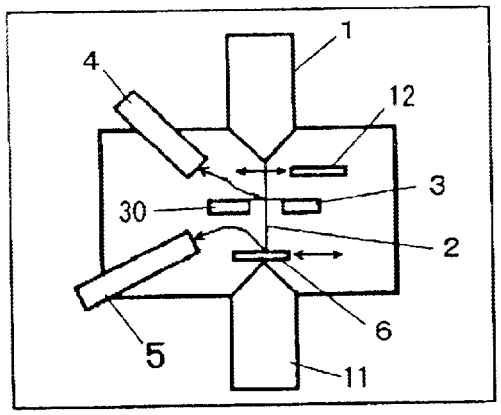
FIGS. 3A, 3B show a first embodiment of the present invention where an FIB lens barrel and an EB lens barrel are located at opposing positions, giving an example where a target for generating secondary electrons is used as the transmission FIB detector.

Next, a description is given of a dual FIB-SEM (TEM) device equipped with an FIB barrel lens for carrying out defect correction and a Scanning Electron Microscope (SEM) or a Transmission Electron Microscope (TEM) for scanning for monitoring the sample. In FIG. 3A there is shown a mask defect correction device where an FIB lens barrel 1 for performing defect correction and an electron beam lens barrel 11 for confirming locations requiring defect correction (including observation and making of three-dimensional correction shapes) are fitted to the mask defect correction device at positions facing each other. A secondary electron detector 4 for confirming an SIM image on the side of the FIB lens barrel 1 and a target for generating secondary electrons 12 (transmission electron detector) used for observing a transmitted image of a mask using an electron beam from an electron beam (EB) lens barrel 11 fitted at a facing position, and a gas gun (not shown) for providing compound gas for use as a raw material to processing regions when performing deposition using FIB, are fitted.

It is necessary for the target for generating secondary electrons 12 to be positioned opposite the EB lens barrel 11 (FIB lens barrel 1) via the mask 3 on the trajectory of the electron beam. This position overlaps with the position of the ion beam trajectory between the FIB lens barrel 1 and the mask 3, and is therefore equipped with a mechanism capable bringing the position of the detector in and out depending on whether the detector is being used or not used. On the other hand, a secondary electron detector 5 for monitoring an SEM image on the rear surface of the mask and a target for generating secondary electrons 6 (transmission-type detector) for detecting an ion beam passing through the mask are provided at the side of the EB lens barrel 11. This target for generating secondary electrons 6 acts on the electron beam trajectory. It is therefore necessary to provide a mechanism capable of depositing and withdrawing the position of the detector according to whether it is being used or not.

In a mechanism capable of bringing in and taking out the position of a detector depending on whether the detector is being used or not, when the detector is in the position for use, the detector functions as a shutter for ensuring that direct irradiation to the other beam lens barrel is avoided.

Figure 3B:
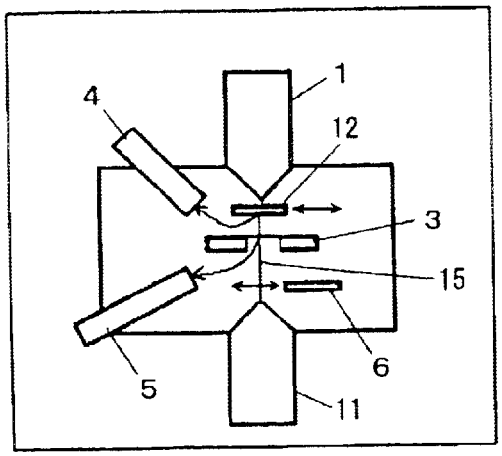

In the situation shown in FIG. 3A, secondary electrons coming from the surface of the mask 3 due to the focused ion beam 2 from the FIB lens barrel 1 are detected by the secondary electron detector 4 and an SIM image is obtained, and secondary electrons from the target for generating secondary electrons 6 located to the rear of the stage 30 are detected by the secondary electron detector 5 to obtain a transmission image. The target for generating secondary electrons 12 is therefore set to the retracted position (not in use) so as to not be in the trajectory of the ion beam and the target for generating secondary electrons 6 is set so as to be in the trajectory of the ion beam (in use). In the situation shown in FIG. 3B, an electron beam is irradiated from the EB lens barrel 11 and secondary electrons from the rear surface of the mask 3 are detected by the secondary lens detector 5 so as to obtain an SIM image, and secondary electrons from the target for generating secondary electrons 12 located at the side of the FIB lens barrel 1 from the sample 3 are detected by the secondary electron detector 4 to obtain a transmission image. During operation, the target for generating secondary electrons 6 is set to the retracted position when not in use so as not to obstruct the electron beam and the target for generating secondary electrons 12 is set to a position in the trajectory of the beam when in use. In this example also, during the correction processing and during scanning, the amount of time and trouble involved in this operation is reduced because it is not necessary to move the sample 3 and there is no fear of creating new defects as a result of dirt becoming attached when moving the sample. Defect portions at deep portions from the surface of the opening of the high aspect ratio mask 3 are also reliably captured by the microscope image and can be observed.

Second Embodiment

Figure 4A:
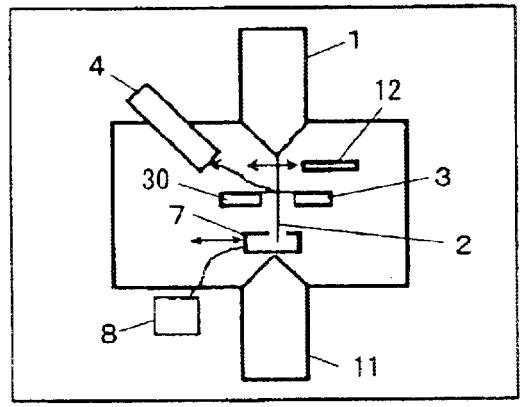
FIGS. 4A–4B show a first embodiment of the present invention where an FIB lens barrel and an EB lens barrel are located at opposing positions, giving an example where a probe current detector is used as the transmission FIB detector.
Figure 4B:
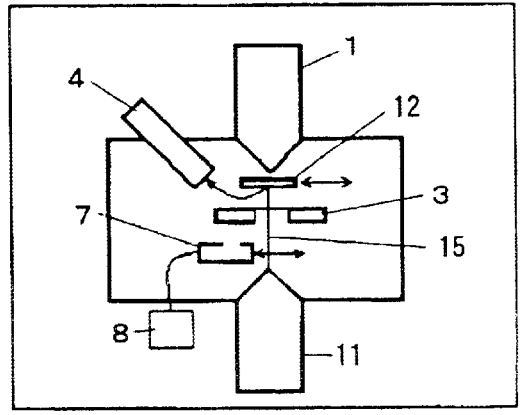

In the example shown in FIG. 4, a transmission probe current detector 7 is used in place of the target for generating secondary electrons 6 of the example of FIG. 3 as the transmission ion beam detector located to the rear of the sample stage 30 and the microscopic current ammeter 8 is also provided for measuring this current. In FIG. 4A, secondary electrons coming from the surface of the mask 3 due to the focused ion beam 2 from the FIB lens barrel 1 are detected by the secondary electron detector 4 and an SIM image is obtained, and current detected by the transmission probe current detector 7 located to the rear of the sample stage 30 is measured by the microscopic current ammeter 8 to obtain a transmission image. The target for generating secondary electrons 12 is therefore set to the retracted position (not in use) so as to not be in the trajectory of the ion beam and the transmission probe current detector 7 is set so as to be in the trajectory of the ion beam (in use). In the situation shown in FIG. 4B, an electron beam is irradiated from the EB lens barrel 11, secondary electrons generated from the target for generating secondary electrons 12 located at the side of the FIB lens barrel 1 from the sample 3 are detected by the secondary electron detector 4 and a transmission image is obtained. During this operation, the transmission probe current detector 7 can be set to a retracted position so as not to obstruct the electron beam. In this example also, during the correction processing and during scanning, the amount of trouble and time involved in this process is reduced because it is not necessary to move the sample 3 and there is no fear of creating new defects as a result of dirt becoming attached when moving the sample. Defect portions at deep portions from the surface of the opening of the high aspect ratio mask 3 are also reliably captured by the microscope image and can be observed.

Third Embodiment

Figure 5A:
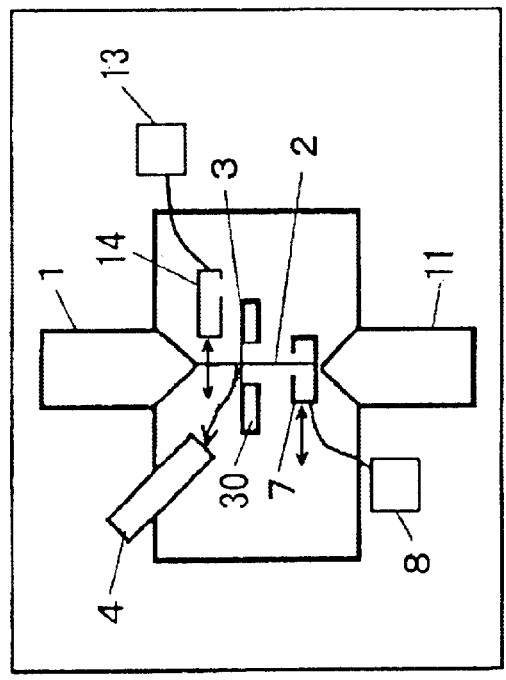
FIGS. 5A–5C are a view illustrating a switching function and a retraction state in an embodiment where an FIB lens barrel and an EB lens barrel are arranged at positions facing each other and which possesses the functions of a target for generating secondary electrons and a probe detector as the transmission FIB detector.
Figure 5C:
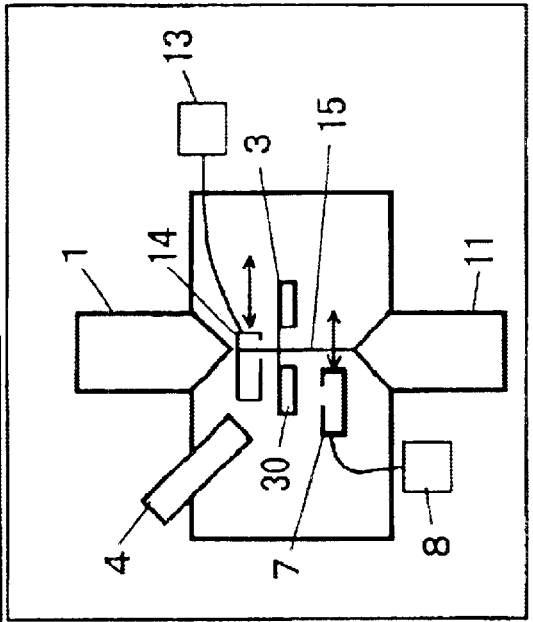
Figure 5B:
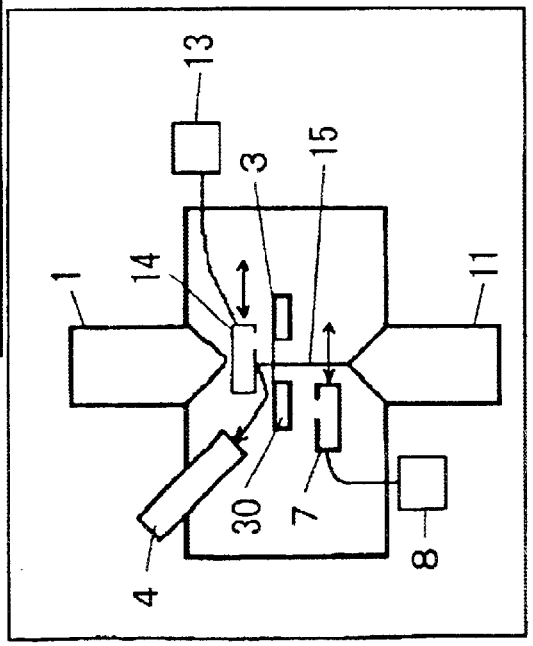

In the example shown in FIG. 5, a combined target for generating secondary electrons and transmission probe current detector 14 is used in place of the target for generating secondary electrons 12 of the example of FIG. 4 as the transmission ion beam detector and a microscopic current ammeter 13 is also provided for measuring this current. The combined target for generating secondary electrons and transmission probe current detector 14 is formed so that the outer surface of the casing of a side irradiated with a beam taken as a transmission probe current detector is taken as a target for generating secondary electrons. In FIG. 5A, secondary electrons coming from the surface of the mask 3 due to the focused ion beam from the FIB lens barrel 1 are detected by the secondary electron detector 4 and an SIM image is obtained, and current detected by the transmission probe current detector 7 located to the rear of the stage is measured by the microscopic current ammeter 8 and a transmission image is obtained. The combined target for generating secondary electrons and transmission probe current detector 14 is therefore set to the retracted position (not in use) so as to not be in the trajectory of the ion beam and the transmission probe current detector 7 is set so as to be in the trajectory of the ion beam (in use). In the situation shown in FIG. 5B, an electron beam is irradiated from the EB lens barrel 11, secondary electrons generated from the combined target for generating secondary electrons and transmission probe current detector 14 located at the side of the FIB lens barrel 1 from the sample 3 are detected by the secondary electron detector 4 and a transmission image is obtained. As shown in FIG. 5, at this time, the position of the combined target for generating secondary electrons and transmission probe current detector 14 is set in such a manner that the outer surface of the casing formed as the target for generating secondary electrons is irradiated by the electron beam. During this operation, the transmission probe current detector 7 not in use can be set to a retracted position so as not to obstruct the electron beam. In the situation shown in FIG. 5C, an electron beam is irradiated from the EB lens barrel 11, and the position of the combined target for generating secondary electrons and transmission probe current detector 14 located to the side of the FIB lens barrel from the sample 3 is such that the electron beam is received within the casing so that this functions as a transmission probe current detector. With the electron beam passing through the mask 3, the combined target for generating secondary electrons and transmission probe current detector 14 functions as a transmission probe current detector, and a transmission image is obtained from current measured by the microscopic ammeter 13. During this operation, the transmission probe current detector 7 not in use can be set to a retracted position so as not to obstruct the electron beam. In this embodiment, in order to obtained the three operations above, switching over of the position of the combined target for generating secondary electrons and transmission probe current detector 14 takes place between three positions of a position for functioning as a target for generating secondary electrons, a position for functioning as a transmission probe current detector, and a retracted position when not in use. In this example also, during the correction processing and during scanning, the amount of time and trouble involved in this process is reduced because it is not necessary to move the sample 3 and there is no fear of creating new defects as a result of dirt becoming attached when moving the sample. Defect portions at deep portions from the surface of the opening of the high aspect ratio mask 3 are also reliably captured by the microscope image and can be observed.

In the above embodiment, the FIB lens barrel 1 and the EB lens barrel 11 are positioned facing each other on the same axis via the sample 3. This has the benefit that observation for both correction processing and scanning can be implemented without having to move the sample 3 from the sample being a mask and having a through-hole structure.

Fourth Embodiment

In the embodiment shown in the following, the device is such that the FIB lens barrel 1 and EB lens barrel 11 are fitted at a certain angle (for example, 55 degrees) as with related dual FIB-SEM devices, and are positioned a certain distance from each other so that the FIB lens barrel 1 and the EB lens barrel 11 do not physically interfere with each other. With that shown in FIG. 6, the FIB lens barrel 1 and the EB lens barrel 11 are fitted at a certain angle. The feature of this embodiment is therefore that the sample stage 30 and the transmitted beam detector are formed integrally and the detector for the transmitted ion beam and the detector for the electron beam are combined. With the embodiment as shown on the left side of the drawing, the target 6 (12) for generating secondary electrons is used as the transmitted beam detector, and with the embodiment as shown on the right of the drawing, a transmission probe current detector 7 is used as the transmitted beam detector. In the situation in FIG. 6A, the sample stage 30 is horizontal and the focused ion beam irradiates the mask 3 from directly above. This transmitted beam is then received by the target for generating secondary electrons 6 (12) and secondary electrons generated as a result are detected by the secondary electron detector 5 so that an FIB transmission image is obtained. In the situation in FIG. 6B, the sample stage 30 is inclined so that the electron beam irradiates the sample surface vertically. This transmitted beam is then received by the target for generating secondary electrons 6 (12) and secondary electrons generated as a result are detected by the secondary electron detector 5 so that an EB transmission image is obtained. In this drawing, the secondary electron detector 5 is fixed to the chamber but this may also be formed integrally with the sample stage 30 and the transmitted beam detector. In the situation in FIG. 6C, the sample stage 30 is horizontal and the mask 3 is irradiated from directly above with a focused ion beam. A transmitted beam is then detected by the transmission probe current detector 7, the detected current is measured by the microscopic current ammeter 8 (13), and an FIB transmission image is obtained. With the situation in FIG. 6D, the sample stage 30 is inclined so that the electron beam irradiates the mask 3 from a vertical direction with respect to the sample surface. This transmitted beam is then received by the transmission probe current detector 7, the detected current is measured by the microscopic current ammeter 8 (13), and an EB transmission image is obtained.

Fifth Embodiment

With that shown in FIG. 7, the FIB lens barrel 1 and the EB lens barrel 1 are spaced a prescribed distance from each other. The feature of this embodiment is therefore also that the sample stage 30 and the transmitted beam detector are formed integrally and the detector for the transmitted ion beam and the detector for the electron beam are combined as with the embodiment in FIG. 6. With the embodiment as shown on the left side of the drawing, the target for generating secondary electrons 6 (12) is used as the transmitted beam detector, and with the embodiment as shown on the right of the drawing, a transmission probe current detector 7 is used as the transmitted beam detector. In the situation in FIG. 7A, the sample stage 30 is on the optical axis of the FIB and the focused ion beam 2 irradiates the mask 3 from directly above. This transmitted beam is then received by the target for generating secondary electrons 6 (12) and secondary electrons generated as a result are detected by the secondary electron detector 5 so that an FIB transmission image is obtained. In the situation in FIG. 7B, the sample stage 30 is made to move along the optical axis of the EB so that the electron beam irradiates the mask 3 from directly above. This transmitted beam is then received by the target for generating secondary electrons 6 (12) and secondary electrons generated as a result are detected by the secondary electron detector 5 so that an EB transmission image is obtained. In this drawing, the secondary electron detector 5 is fixed to the chamber but this may also be formed integrally with the sample stage 30 and the transmitted beam detector.

Figure 7A:
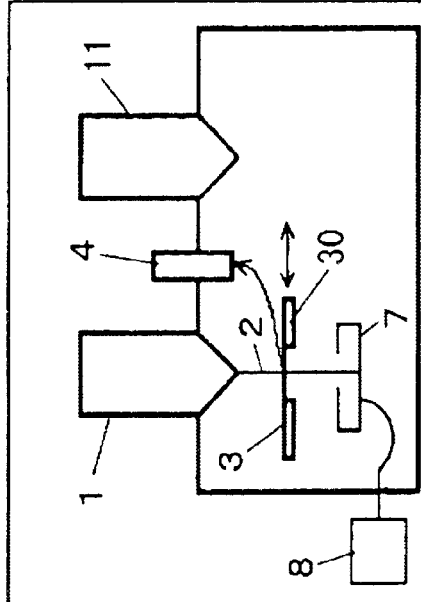
FIGS. 7A–7D are a view illustrating an embodiment where an FIB lens barrel and an BB lens barrel are arranged at positions in parallel with each other at a prescribed interval and which adopts a target for generating secondary electrons and a probe current detector as the transmitted beam detector.
Figure 7B:
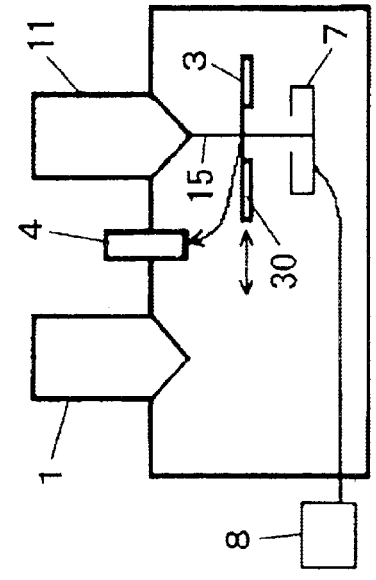
Figure 7C:
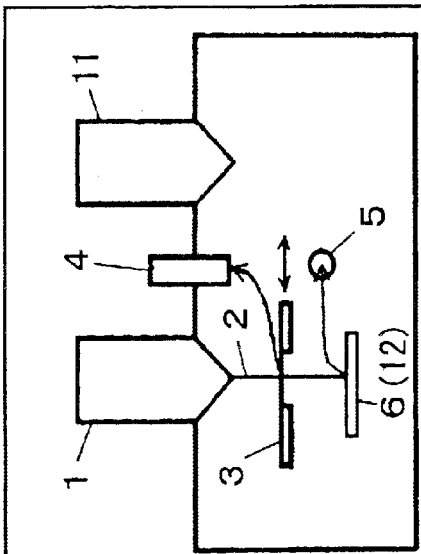
Figure 7D:
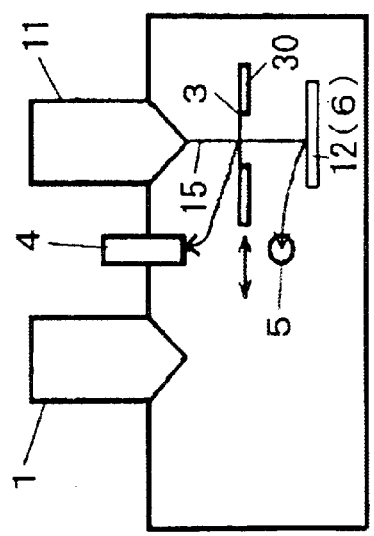
Figure 8A:
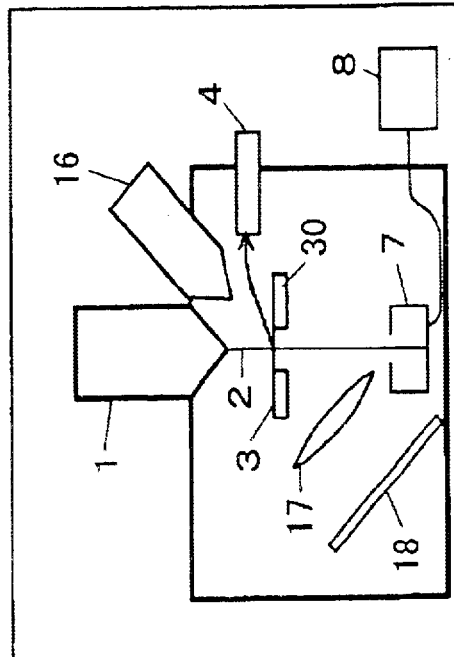
FIGS. 8A–8D are a view illustrating an embodiment where an FIB lens barrel and a TEM lens barrel are arranged at positions facing each other at a prescribed angle, which is provided with a lens system and a projection plate as a transmitted electron detector and which adopts a target for generating secondary electrons and a probe current detector as the transmission FIB detector.
Figure 8C:
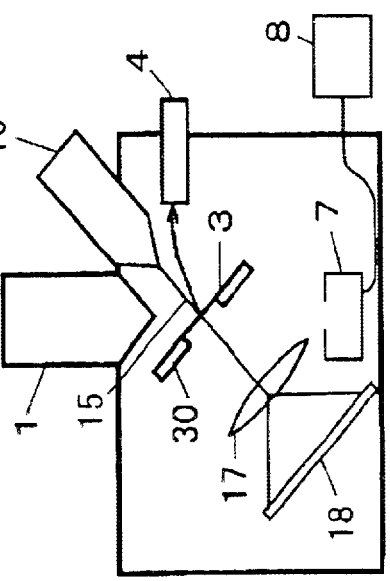
Figure 8B:
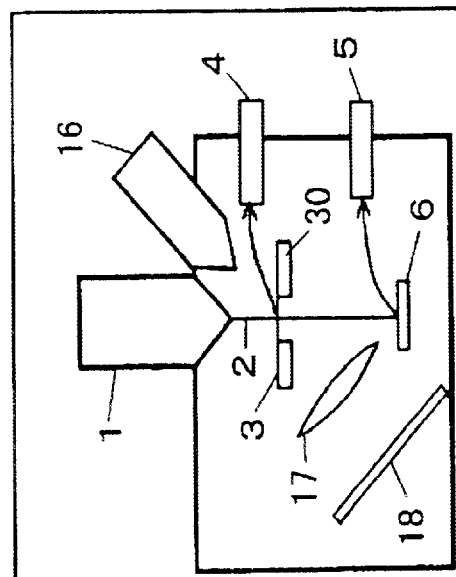
Figure 8D:
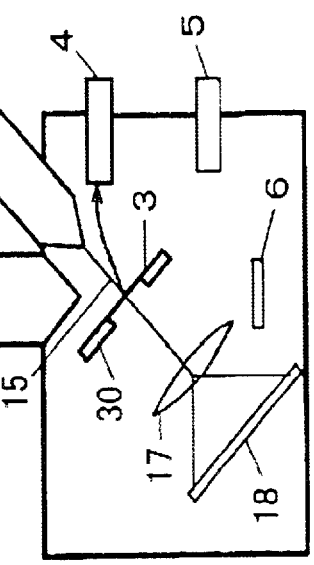

In the situation in FIG. 7C, the sample stage 30 is on the optical axis of the FIB and the mask 3 is irradiated from directly above with a focused ion beam. A transmitted beam is then detected by the transmission probe current detector 7, the detected current is measured by the microscopic current ammeter 8 (13), and an FIB transmission image is obtained. With the situation in FIG. 7D, the sample stage 30 is moved along the optical axis of the EB so that the electron beam irradiates the mask 3 from directly above. This transmitted beam is then received by the transmission probe current detector 7, the detected current is measured by the microscopic current ammeter 8 (13), and an EB transmission image is obtained.

Sixth Embodiment

In the next embodiment, a Transmission Electron Microscope (TEM) lens barrel is used instead of the SEM microscope lens barrel as the electron microscope. The SEM image is an image formed by combining information for every deflection scanning position and this TEM image is formed as a single image on a projection surface using a lens system for a portion where the beam is transmitted.

In the embodiment shown in FIG. 8, the FIB lens barrel 1 and the TEM lens barrel 16 are fitted at a certain angle (for example 55 degrees). The detector for detecting the transmitted FIB, the lens for projecting and forming the TEM image and the projection plate are respectively arranged on the optical axis. With the embodiment as shown on the left side of the drawing, the target 6 for generating secondary electrons is used as the transmitted FIB detector, and with the embodiment as shown on the right of the drawing, a transmission probe current detector 7 is used as the transmission FIB detector. In the situation in FIG. 8A, the sample stage 30 is horizontal and the focused ion beam irradiates the mask 3 from directly above. This transmitted beam is then received by the target for generating secondary electrons 6 and secondary electrons generated as a result are detected by the secondary electron detector 5 so that an FIB transmission image is obtained. In the situation in FIG. 8B, the sample stage 30 is inclined so that an electron beam for observation 15 comes from a vertical direction with respect to the sample surface. A TEM image is then obtained for the transmitted beam on a projection plate 18 via a transmitted electron beam enlarging/projecting lens 17. In the situation in FIG. 8C, the sample stage 30 is horizontal and the mask 3 is irradiated from directly above with a focused ion beam 2. A transmitted beam is then detected by the transmission probe current detector 7, the detected current is measured by the microscopic current ammeter 8, and an FIB transmission image is obtained. With the situation in FIG. 8D, the sample stage 30 is inclined so that the electron beam for observation 15 irradiates the mask 3 from a vertical direction with respect to the sample surface. A TEM image is then obtained for this transmitted beam on the projection plate 18 via the transmission electron beam enlarging/projecting lens 17.

Seventh Embodiment

In that shown in FIG. 9, the FIB lens barrel 1 and the TEM lens barrel 16 are fitted at a prescribed distance from each other. The detector for detecting the transmitted FIB, the lens for projecting and forming the TEM image and the projection plate are respectively arranged on the optical axis. With the embodiment as shown on the left side of the drawing, the target for generating secondary electrons 6 is used as the transmitted FIB detector, and with the embodiment as shown on the right of the drawing, a transmission probe current detector 7 is used as the transmission FIB detector. In the situation in FIG. 9A, the sample stage 30 is on the optical axis of the FIB and the focused ion beam 2 irradiates the mask 3 from directly above. This transmitted beam is then received by the target for generating secondary electrons 6 and secondary electrons generated as a result are detected by the secondary electron detector 5 so that an FIB transmission image is obtained. In the situation in FIG. 9B, the sample stage 30 is moved on the optical axis of the EB so that the electron beam for observation 15 irradiates the mask 3 from directly above. A TEM image is then obtained for the transmitted beam on a projection plate 18 via a transmitted electron beam enlarging/projecting lens 17.

Figure 9A:
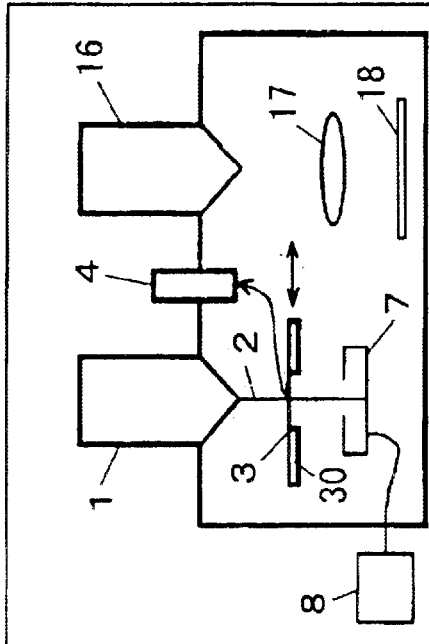
FIGS. 9A–9D are a view illustrating an embodiment where an FIB lens barrel and an TEM lens barrel are arranged in parallel at positions facing each other at a prescribed spacing, which is provided with a lens system and a projection plate as a transmitted electron detector and which adopts a target for generating secondary electrons and a probe current detector as the transmission FIB detector.
Figure 9C:
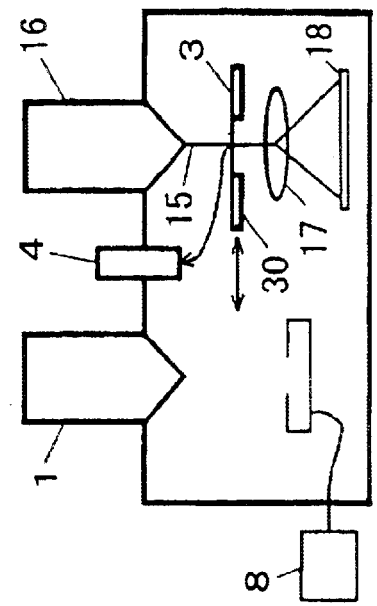
Figure 9B:
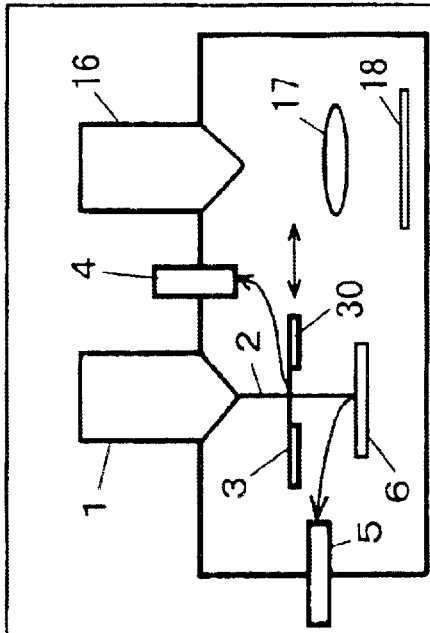
Figure 9D:
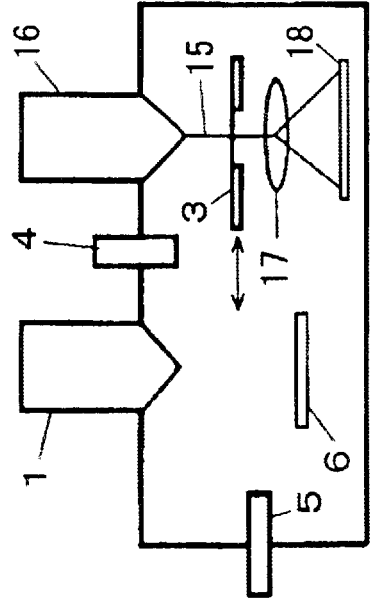
Figure 10A:
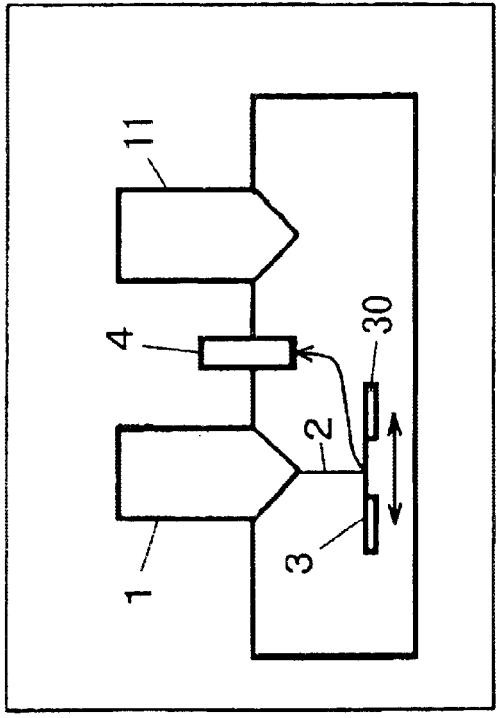
FIGS. 10A–10D are a view illustrating the structure of a related dual FIM-SEM device.
Figure 10B:
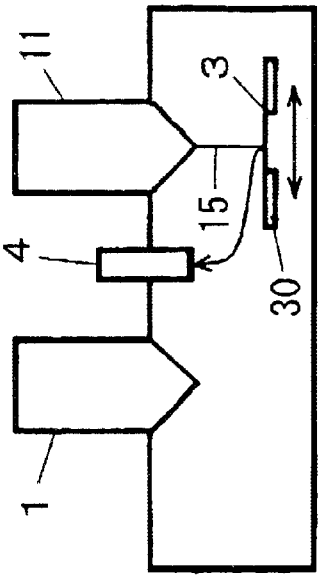
Figure 10C:
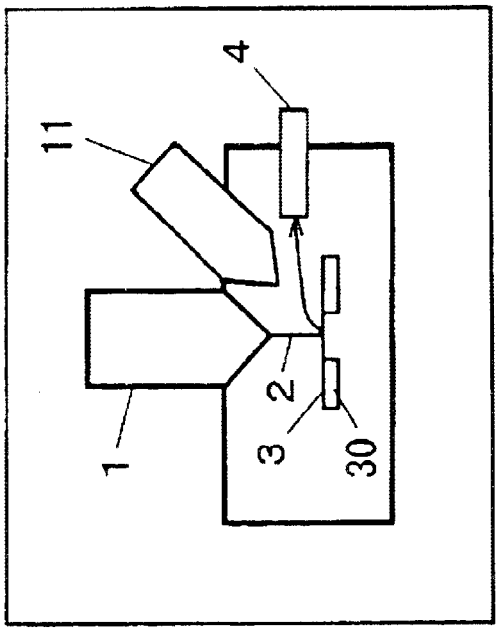
Figure 10D:
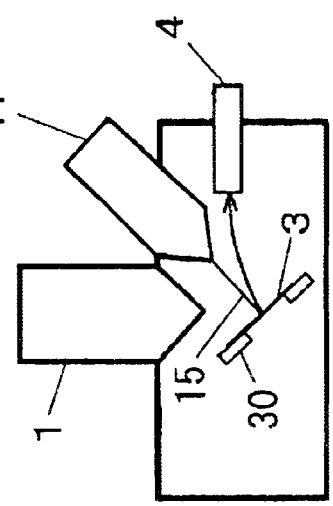

In the situation in FIG. 9C, the sample stage 30 is on the optical axis of the FIB and the mask 3 is irradiated from directly above with a focused ion beam. A transmitted beam is then detected by the transmission probe current detector 7, the detected current is measured by the microscopic current ammeter 8, and an FIB transmission image is obtained. With the situation in FIG. 9D, the sample stage 30 is moved onto the optical axis of the EB so that the electron beam for observation 15 irradiates the mask 3 from directly above. A TEM image is then obtained for this transmitted beam on the projection plate 18 via the transmission electron beam enlarging/projecting lens 17.

A fluorescent body to which a fluorescent substance is applied is used as the projection plate 18 used in the embodiment shown in FIG. 8 and FIG. 9. A projected image for portions through which the electron beam for observation 15 is transmitted is taken as a visible image, with this then being shown on a display using a video camera.

The fine stencil structure correction device of the present invention comprises a device for irradiating and scanning with a charged particle beam so as to correct shapes of defects at locations of a fine stencil structure sample using an etching or deposition function, where means for detecting a transmitted beam are located to the rear of the sample as viewed from the beam source. A scanning image is obtained for the beam passing through through-holes of the ultra-fine stencil structure. As a result, at a hole of a high aspect ratio, three-dimensional defect shapes can be observed and understood regardless of depth. In the present invention adopting an absorbed current detector or beam target for emitting secondary electrons and secondary charged particle detector, a beam transmitted through a through-hole in an ultra-fine stencil structure can be reliably captured and the desired defect shape can be clearly observed and understood.

The fine stencil structure correction device of the present invention comprising a scanning transmission electron microscope function taken as a primary beam for observation as well as a primary beam for processing can utilize transmission images using an electron beam. More reliable determinations are therefore possible for defect shapes under conditions closer to actual conditions of use. It is therefore possible to set the processing conditions required for more accurate correction than in the related art by making shapes for correction by comparing patterns for analogous patterns for peripheral parts. At this time, it is possible to set more accurate three-dimensional correction processing conditions by combining a mask transmission image using an electron beam, a mask rear surface SEM image, and an SIM image using an FIB for the mask surface. Observation of a transmission image from an electron microscope that inflicts little damage on the sample due to the ion beam is therefore possible, troublesome procedures and consumption of time are avoided because observation can be achieved in the same chamber, and there is no fear of the occurrence of new defects resulting from dirt becoming affixed during movement of samples between devices.

The fine stencil structure correction device of the present invention further comprises a scanning transmission electron microscope function taken as a primary beam for observation as well as a primary beam for processing. A lens system for projecting and enlarging transmitted electrons transmitted by a transmission hole of the fine stencil structure sample and a projection plate are then adopted as means for detecting the transmitted beam located to the rear of the sample. Therefore, by taking a transmission electron microscope image that subjected the sample to little damage using an ion beam, it is possible to observe and understand a defect shape three-dimensionally regardless of the depth of the high aspect ratio hole.

The ultra-fine stencil structure correction device of the present invention is based squarely on the sample having a through-hole structure. By then arranging a charged particle lens barrel for a primary beam for processing and an electron lens barrel for a primary beam for observation opposite each other so as to sandwich the fine stencil structure sample, correction processing and scanning can be alternately carried out without having to move the sample on the stage. Troublesome procedures and consumption of time such as position alignment work can therefore be omitted and there is no fear of creating new defects as a result of dirt becoming attached when moving the sample. As it is therefore possible for a retracted state to be adopted when not in use, not only do the transmitted beam detectors not become an obstacle to beam irradiation of the other beam detector, but this functions as a shutter for ensuring that the transmitted beam detector in a certain position during use is such that the other beam lens barrel is not directly irradiated with a beam.

Further, the fine stencil structure correction device is such that the means for detecting a transmitted beam located to the rear of the sample is capable of switching over between functioning as an absorbed current detector and functioning as a beam target for emitting secondary electrons. Two types of transmission images can therefore be obtained with a simple, compact structure. The fine stencil structure correction device of the present invention performing function switching for switching between an absorbed current detector and a beam target function for emitting secondary electrons and having three positions for ensuring there is no obstruction of other beam irradiation is capable of arranging EB lens barrels at opposing positions and is therefore capable of implementing a multitude of functions with a compact configuration.

What is claimed is:

1. A sample correction device comprising: a sample stage for supporting thereon a sample; a first charged particle beam lens barrel for emitting a first charged particle beam for scanning across the sample and correcting a shape defect in the sample by etching or deposition; and first transmitted beam detecting means for detecting a first transmitted beam comprised of the first charged particle beam penetrating through the sample when the sample is supported on the sample stage and is being irradiated by the first charged particle beam.

2. A sample correction device according to claim 1; wherein the sample comprises a fine stencil structure.

3. A sample correction device according to claim 1; wherein the sample comprises an electron beam exposure mask.

4. A sample correction device according to claim 1; wherein the first charged particle beam lens barrel is provided over a first side of the sample stage.

5. A sample correction device according to claim 4; wherein the first transmitted beam detecting means is provided under a second side of the sample stage opposite the first side.

6. A sample correction device according to claim 1; wherein the sample stage has a hole therethrough over which the sample is positioned.

7. A sample correction device according to claim 1; wherein the first transmitted beam detecting means comprises an absorbed current detector which is disposable in a path of the first transmitted beam to generate a current in response thereto, and a current meter for measuring the current.

8. A sample correction device according to claim 7; wherein the absorbed current detector is removably disposable in the path of the first transmitted beam.

9. A sample correction device according to claim 1; wherein the first transmitted beam detecting means comprises a beam target which is disposable in a path of the first transmitted beam for emitting secondary charged particles in response to irradiation by the first transmitted beam, and a secondary charged particle detector for detecting the secondary charged particles emitted by the beam target.

10. A sample correction device according to claim 1; wherein the first charged particle beam lens barrel comprises a focused ion beam lens barrel.

11. A sample correction device according to claim 10; wherein the focused ion beam lens barrel is provided over a first side of the sample stage, and the first transmitted beam detecting means is disposable in a path of the first transmitted beam.

12. A sample correction device according to claim 11; wherein the first transmitted beam detecting means is provided under a second side of the sample stage opposite the first side.

13. A sample correction device according to claim 1; wherein the first charged particle beam lens barrel is provided over a first side of the sample stage; and further comprising a second charged particle beam lens barrel provided under a second side of the sample stage opposite the first side for emitting a second charged particle beam; and second transmitted beam detecting means for detecting a second transmitted beam comprised of the second charged particle beam penetrating through the sample when the sample is supported on the sample stage and is being irradiated by the second charged particle beam.

14. A sample correction device according to claim 13; wherein the second transmitted beam detecting means comprises an absorbed current detector which is disposable in a path of the second transmitted beam for generating a current in response thereto, and a current meter for measuring the current.

15. A sample correction device according to claim 14; wherein the absorbed current detector is removably disposable in the path of the second transmitted beam.

16. A sample correction device according to claim 13; wherein at least one of the first and second transmitted beam detecting means comprises an absorbed current detector which also functions as a beam target for emitting secondary electrons when a position of the absorbed current detector is changed relative to the first or second charged particle beam.

17. A sample correction device according to claim 13; wherein the second transmitted beam detecting means comprises a beam target which is disposable in a path of the second transmitted beam to emit secondary charged particles in response thereto, and a secondary charged particle detector for detecting the secondary charged particles emitted by the beam target.

18. A sample correction device according to claim 13; wherein the first charged particle beam lens barrel comprises a focused ion beam lens barrel, and the second charged particle beam lens barrel comprises an electron beam lens barrel.

19. A sample correction device according to claim 18; wherein the first transmitted beam detecting means comprises a first absorbed current detector which is removably disposable under the second side of the sample stage in a path of the first transmitted beam and a path of the second charged particle beam for generating a first current in response to irradiation with the first transmitted beam, and a current meter for measuring the first current, and the second transmitted beam detecting means comprises a second absorbed current detector which is removably disposable over the first side of the sample stage in a path of the second transmitted beam and a path of the first charged particle beam for generating a second current in response to irradiation with the second transmitted beam, and a current meter for measuring the second current.

20. A sample correction device according to claim 18; wherein the first transmitted beam detecting means comprises a first beam target which is removably disposable under the second side of the sample stage in a path of the first transmitted beam for emitting secondary charged particles in response to irradiation with the first transmitted beam, and a secondary charged particle detector for detecting the secondary charged particles emitted by the first beam target, and the second transmitted beam detecting means comprises a second beam target which is removably disposable over the first side of the sample stage in a path of the second transmitted beam for emitting secondary charged particles in response to irradiation with the second transmitted beam, and a secondary charged particle detector for detecting the secondary charged particles emitted by the second beam target.

21. A sample correction device according to claim 1; further comprising a scanning transmission electron microscope lens barrel for irradiating the sample with a primary electron beam; and transmitted electron beam detecting means for detecting a transmitted electron beam comprised of the primary electron beam penetrating through the sample while the sample is being irradiated by the primary electron beam.

22. A sample correction device according to claim 21; wherein the transmitted electron beam detecting means comprises one or more lenses for enlarging the transmitted electron beam, and a projection plate onto which the enlarged electron beam is projected.

23. A sample correction device according to claim 1; further comprising a scanning electron microscope lens barrel for irradiating the sample with a primary electron beam that penetrates through the sample.

24. A sample correcting device according to claim 23; wherein the first charged particle beam lens barrel and the scanning electron microscope lens barrel are provided on opposite sides of the sample stage; and further comprising second transmitted beam detecting means provided between the sample stage and the first charged particle beam lens barrel for detecting a second transmitted electron beam comprised of the primary electron beam penetrating through the sample while being irradiated by the primary electron beam; wherein the first and second transmitted beam detecting means are each alternately retracted when not in use so as not to obstruct beam irradiation by an unused one of the lens barrels.

25. A sample correction device according to claim 24; wherein at least one of the first and second transmitted beam detecting means comprises an absorbed current detector which also functions as a beam target for emitting secondary electrons when a position of the absorbed current detector is changed relative to the charged particle beam or the electron beam.

26. A sample correction device according to claim 24; wherein at least one of the first and second transmitted beam detecting means comprises a movable absorbed current detector which detects an absorbed current in a first position, functions as a beam target for emitting secondary electrons in a second position, and does not function as an absorbed current detector or a beam target in a third position in which it is retracted so as not to obstruct beam irradiation from an unused one of the lens barrels.

27. A fine stencil structure correction device comprising: a sample stage for supporting thereon a fine stencil structure; a focused ion beam lens barrel disposed over the sample stage for emitting a focused ion beam for scanning across the fine stencil structure and correcting a shape defect in the fine stencil structure by etching or deposition; first transmitted beam detecting means for detecting a first transmitted beam comprised of the focused ion beam penetrating through the fine stencil structure when the fine stencil structure is supported on the sample stage and is being irradiated by the focused ion beam; an electron beam lens barrel disposed under the sample stage for emitting an electron beam for scanning across the fine stencil structure for observing the fine stencil structure; and second transmitted beam detecting means for detecting a second transmitted beam comprised of the electron beam penetrating through the fine stencil structure when the fine stencil structure is supported on the sample stage and is being irradiated by the electron beam.

28. A sample correction device according to claim 27; wherein each of the first and second transmitted beam detecting means comprises one of an absorbed current detector and a beam target which is removably disposable in a path of the first and second transmitted beams to generate a current in response thereto.

* * * * *